United States Patent
Chang

(10) Patent No.: US 8,552,461 B2
(45) Date of Patent: Oct. 8, 2013

(54) LIGHT EMITTING DIODE WITHOUT LEADS

(75) Inventor: Kuo-Cheng Chang, Miao-Li (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 52 days.

(21) Appl. No.: 13/300,663

(22) Filed: Nov. 21, 2011

(65) Prior Publication Data

US 2013/0126931 A1 May 23, 2013

Related U.S. Application Data

(66) Substitute for application No. 12/904,145, filed on Oct. 13, 2010, now abandoned.

(51) Int. Cl.
*H01L 33/38* (2010.01)
(52) U.S. Cl.
USPC .......... 257/99; 257/76; 257/94; 257/E33.014; 257/E33.016; 257/E33.065
(58) Field of Classification Search
None
See application file for complete search history.

(56) References Cited

U.S. PATENT DOCUMENTS

| 8,357,951 | B2 * | 1/2013 | Chang | 257/99 |
| 2010/0207127 | A1 * | 8/2010 | Chen | 257/79 |
| 2011/0198660 | A1 * | 8/2011 | Bae et al. | 257/99 |
| 2011/0204402 | A1 * | 8/2011 | Jeong et al. | 257/98 |
| 2012/0025241 | A1 * | 2/2012 | Xiao et al. | 257/98 |
| 2012/0261686 | A1 * | 10/2012 | Lu | 257/91 |

\* cited by examiner

*Primary Examiner* — Minh-Loan T Tran
*Assistant Examiner* — Fazli Erdem
(74) *Attorney, Agent, or Firm* — Altis & Wispro Law Group, Inc.

(57) ABSTRACT

An LED (light emitting diode) includes a seat and an LED chip. The seat includes a main body, and a first electrode and a second electrode formed on the main body. The LED chip includes a first semiconductor layer, an annular light-emitting layer encircling the first semiconductor layer, and an annular second semiconductor layer encircling the light-emitting layer. The first electrode electrically connects with the first semiconductor layer, and the second electrode electrically connects with the second semiconductor layer.

20 Claims, 3 Drawing Sheets

LIGHT EMITTING DIODE WITHOUT LEADS

BACKGROUND

1. Technical Field

The disclosure relates to light emitting diodes (LEDs) and, more particularly, relates to an improved LED without leads.

2. Description of Related Art

Presently, LEDs are preferred for use in non-emissive display devices than CCFLs (cold cathode fluorescent lamp) due to their high brightness, long lifespan, and wide color range.

A typical LED includes a seat, an LED chip disposed on the seat and an encapsulation material encapsulating the LED chip. The LED chip has two electrodes for being electrically connected to outer electrodes formed on the seat. The two electrodes of the LED chip are generally connected to the outer electrodes of the seat via two leads, respectively. However, in molding of the LED, the lead, which is usually made of a golden wire, is so thin that it is prone to be broken.

What is needed, therefore, is an LED which overcomes the above-mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
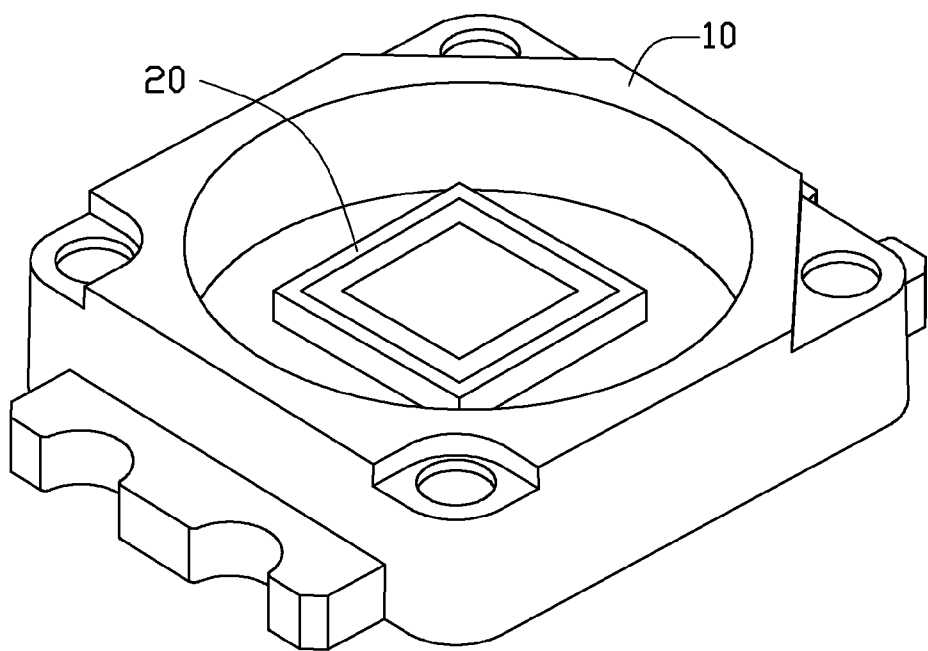
FIG. 1 is an isometric, assembled view of an LED in accordance with a first embodiment of the disclosure, wherein an encapsulant of the LED is removed for clarity.

Referring to FIG. 1, a light emitting diode (LED) in accordance with a first embodiment of the disclosure is illustrated. The LED comprises a seat 10, an LED chip 20 disposed on the seat 10 and an encapsulant (not shown) covering the LED chip 20.

Figure 2:
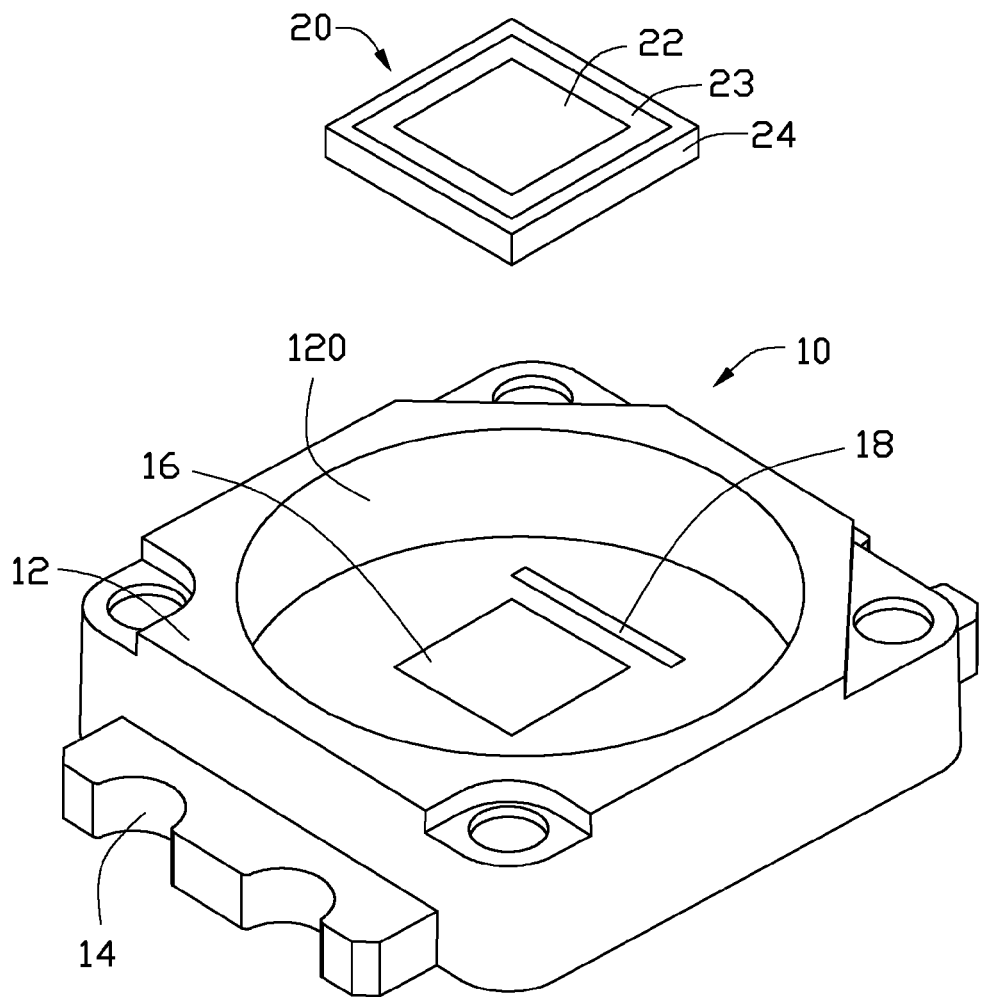
FIG. 2 is an exploded view of the LED of FIG. 1.

Referring to FIG. 2 also, the seat 10 comprises a main body 12 and two electrical feet 14 extending outwardly from two opposite lateral sides of the main body 12, respectively. A top face of the main body 12 is concaved downwardly to form a depression 120. The depression 120 has a flat face on which the LED chip 20 is attached. The seat 10 further comprises a first electrode 16 and a second electrode 18 formed on the flat face of the depression 120. The first electrode 16 is spaced and electrically insulating from the second electrode 18. The first electrode 16 and the second electrode 18 are electrically connected with the electrical feet 14, respectively. The first electrode 16 is located at a center of the flat face of the depression 120, and the second electrode 18 is located adjacent to the first electrode 16. In the present embodiment of this disclosure, the first electrode 16 is rectangular-shaped, and the second electrode 18 is elongated and strip-shaped.

The LED chip 20 comprises a first semiconductor layer 22, an annular light-emitting layer 23 encircling the first semiconductor layer 22, and an annular second semiconductor layer 24 encircling the light-emitting layer 23. The first electrode 16 has a shape similar to that of the first semiconductor layer 22. The LED chip 20 has a shape like a rectangle plate. The LED chip 20 is disposed on the first and second electrodes 16, 18. The first electrode 16 directly and electrically connects with the first semiconductor layer 22. The second electrode 18 directly and electrically connects with the second semiconductor layer 24. In the embodiment of this disclosure, the LED chip 20 is made of a Group III-V semiconductor material, the first semiconductor layer 22 is an N-type semiconductor layer, and the second semiconductor layer 24 is a P-type semiconductor layer, the light-emitting layer 23 is sandwiched between the N-type semiconductor layer and the P-type semiconductor layer.

Figure 3:
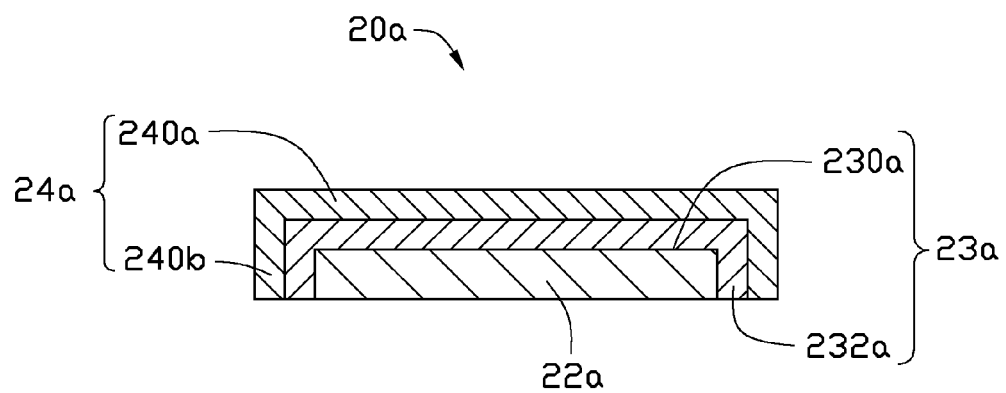
FIG. 3 shows a cross-sectional view of an LED chip of an LED in accordance with a second embodiment of the disclosure.

Referring to FIG. 3 also, in a second embodiment of this disclosure, the LED chip 20a comprises a first semiconductor layer 22a, a second semiconductor layer 24a, and a light-emitting layer 23a sandwiched between the first semiconductor layer 22a and a second semiconductor layer 24a. The light-emitting layer 23a comprises a cover 230a and an annular edge 232a protruding downwardly from an outer circumference of the cover 230a. The cover 230a correspondingly covers a top surface of the first semiconductor layer 22a, and the edge 232a correspondingly encircles an edge of the first semiconductor layer 22a. The second semiconductor layer 24a has a configuration similar to that the light-emitting layer 23a and comprises a cover 240a correspondingly covering a top surface of the cover 230a of the light-emitting layer 23a, and an annular edge 240b correspondingly encircling the edge 232a of the light-emitting layer 23a. The first electrode 16 directly and electrically connects with the first semiconductor layer 22a. The second electrode 18 directly and electrically connects with the edge 240b of the second semiconductor layer 24a.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED (light emitting diode) without leads comprising:
   a seat comprising a main body, two electrical feet extending outwardly from two opposite lateral sides of the main body, respectively, and a first electrode and a second electrode formed on the main body, the first electrode and the second electrode being electrically connected to the two electrical feet without leads on the main body, respectively; and
   an LED chip attached on the main body, the LED chip comprising a first semiconductor layer, an annular light-emitting layer encircling the first semiconductor layer, and an annular second semiconductor layer encircling the light-emitting layer;
   wherein the first electrode electrically connects with the first semiconductor layer, and the second electrode electrically connects with the second semiconductor layer.

2. The LED as described in claim 1, wherein a top face of the main body is concaved downwardly to form a depression, and the depression has a flat face on which the LED chip is attached.

3. The LED as described in claim 1, wherein the first electrode directly contacts with the first semiconductor layer.

4. The LED as described in claim 1, wherein the second electrode directly contacts with the second semiconductor layer.

5. The LED as described in claim 1, wherein the first electrode has a shape similar to that of the first semiconductor layer.

6. The LED as described in claim 1, wherein the first electrode is spaced and electrically insulating from the second electrode.

7. The LED as described in claim 1, wherein the second electrode is elongated and strip-shaped.

8. The LED as described in claim 1, wherein the LED chip is made of a Group III-V semiconductor material, the first semiconductor layer is an N-type semiconductor layer, and the second semiconductor layer is a P-type semiconductor layer.

9. An LED (light emitting diode) without leads comprising:
a seat comprising a main body, two electrical feet extending outwardly from two opposite lateral sides of the main body, respectively, and a first electrode and a second electrode formed on the main body, the first electrode and the second electrode being electrically connected to the two electrical feet without leads on the main body, respectively; and
an LED chip attached on the main body, the LED chip comprising a first semiconductor layer located at an inmost portion of the LED chip, a second semiconductor layer located at an outmost portion of the LED chip, and a light-emitting layer sandwiched between the first semiconductor layer and the second semiconductor layer;
wherein the first electrode electrically connects with the first semiconductor layer, and the second electrode electrically connects with the second semiconductor layer.

10. The LED as described in claim 9, wherein the light-emitting layer comprises a cover covering the first semiconductor layer, and an annular edge protruding downwardly from an outer circumference of the cover and encircling the first semiconductor layer.

11. The LED as described in claim 10, wherein the second semiconductor layer comprises a cover covering the cover of the light-emitting layer, and an annular edge encircling the edge of the light-emitting layer.

12. The LED as described in claim 11, wherein the first electrode directly contacts with the first semiconductor layer.

13. The LED as described in claim 11, wherein the second electrode directly contacts with the edge of the second semiconductor layer.

14. The LED as described in claim 11, wherein the first electrode directly has a shape similar to that of the first semiconductor layer.

15. The LED as described in claim 9, wherein the first electrode is spaced and electrically insulating from the second electrode.

16. The LED as described in claim 9, wherein the second electrode is elongated and strip-shaped.

17. The LED as described in claim 1, wherein the first semiconductor layer and the second semiconductor layer are coplanar with each other to define a plane facing the main body of the seat.

18. The LED as described in claim 1, wherein the two electrical feet extend outwardly from the main body along two opposite directions.

19. The LED as described in claim 9, wherein the first semiconductor layer and the second semiconductor layer are coplanar with each other to define a plane facing the main body of the seat.

20. The LED as described in claim 9, wherein the two electrical feet extend outwardly from the main body along two opposite directions.

* * * * *